United States Patent
Murphy

(10) Patent No.: US 7,218,029 B2
(45) Date of Patent: May 15, 2007

(54) ADJUSTABLE COMPENSATION OF A PIEZO DRIVE AMPLIFIER DEPENDING ON MODE AND NUMBER OF ELEMENTS DRIVEN

(75) Inventor: Terence J. Murphy, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 655 days.

(21) Appl. No.: 10/910,222

(22) Filed: Aug. 2, 2004

(65) Prior Publication Data

US 2005/0012432 A1 Jan. 20, 2005

Related U.S. Application Data

(60) Division of application No. 09/682,166, filed on Jul. 30, 2001, now Pat. No. 6,825,590, and a continuation of application No. 09/681,695, filed on May 22, 2001, now Pat. No. 6,617,758.

(51) Int. Cl.
H01L 41/06 (2006.01)
H01L 41/08 (2006.01)

(52) U.S. Cl. .................... 310/316.01; 310/323.01; 310/323.13

(58) Field of Classification Search ........... 310/323.06, 310/314, 316.01, 316.02, 316.03, 317, 318, 310/321, 326, 328, 323.01, 323.13, 323.02, 310/320; 318/116
See application file for complete search history.

(56) References Cited

U.S. PATENT DOCUMENTS

| | | | | | |
|---|---|---|---|---|---|
| 4,263,527 | A | * | 4/1981 | Comstock | 310/316.03 |
| 5,434,467 | A | * | 7/1995 | Abe et al. | 310/366 |
| 5,479,062 | A | * | 12/1995 | Yoshino | 310/316.03 |
| 5,554,904 | A | * | 9/1996 | Terajima | 310/316.01 |
| 5,635,787 | A | * | 6/1997 | Mori et al. | 310/321 |
| 5,955,819 | A | * | 9/1999 | Takano et al. | 310/316.01 |
| 6,072,267 | A | * | 6/2000 | Atsuta | 310/323.06 |
| 6,081,061 | A | * | 6/2000 | Reineke et al. | 310/316.03 |
| 6,111,335 | A | * | 8/2000 | Acatrinei | 310/316.03 |
| 6,246,152 | B1 | * | 6/2001 | Fontanella et al. | 310/317 |
| 6,465,933 | B1 | * | 10/2002 | North, Jr. | 310/317 |
| 6,492,760 | B1 | * | 12/2002 | Matsuda et al. | 310/323.02 |
| 2004/0145273 | A1 | * | 7/2004 | Khoury et al. | 310/316.03 |

* cited by examiner

Primary Examiner—Darren Schuberg
Assistant Examiner—Julio C. Gonzalez
(74) Attorney, Agent, or Firm—W. Daniel Swayze, Jr.; W. James Brady; Frederick J. Telecky, Jr.

(57) ABSTRACT

An integrated circuit (42) provides drive signals to a piezo element (48) of a milli-actuator device (20) in a mass data storage device (10). The integrated circuit (42) includes a circuit (61) for selectively operating the integrated circuit (42) in either a voltage or a charge mode of operation. A first amplifier circuit (44) can be compensated for a variable number of piezo elements in the charge mode of operation by adjustable output impedance adjusting elements (124, 126, 138–141) that are switchably connectable into the amplifier circuit (44).

9 Claims, 5 Drawing Sheets

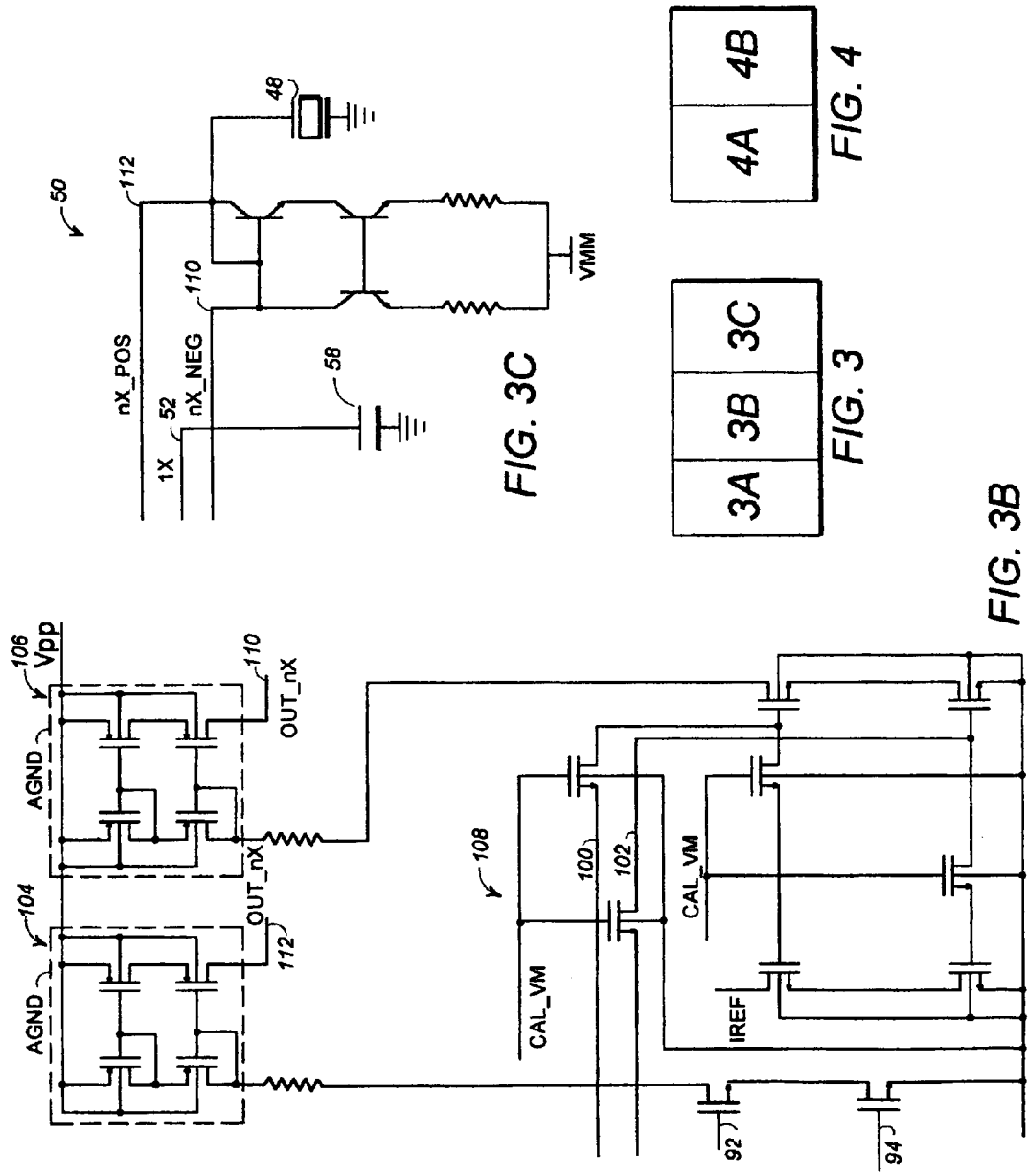

ADJUSTABLE COMPENSATION OF A PIEZO DRIVE AMPLIFIER DEPENDING ON MODE AND NUMBER OF ELEMENTS DRIVEN

CROSS REFERENCE TO RELATED APPLICATIONS

This is a continuation-in-part of U.S. patent application Ser. No. 09/681,695 filed May 22, 2001 now U.S. Pat. No. 6,617,758 and divisional of U.S. patent application Ser. No. 09/682,166 filed Jul 30, 2001 now U.S. Pat. No. 6,825,590.

BACKGROUND OF INVENTION

1. Field of Invention

This invention relates in part to improvements in methods and apparatuses for dynamic information storage or retrieval, and more particularly to improvements in methods and circuitry for positioning a transducer for writing or detecting data written onto a spinning data disk, and still more particularly to improvements in circuits for driving piezo-based milli-actuator structures and methods for making same.

2. Relevant Background

Mass data storage devices include well known hard disk drives that have one or more spinning magnetic disks or platters onto which data is recorded for storage and subsequent retrieval. Hard disk drives may be used in many applications, including personal computers, set top boxes, video and television applications, audio applications, or some mix thereof. Many applications are still being developed. Applications for hard disk drives are increasing in number, and are expected further to increase in the future.

In the construction of mass data storage devices, a data transducer, or head, is generally carried by an arm that is selectively radially positionable by a servo motor. Recently, so-called milli-motors, or milli-actuators, have been considered to provide better, or more accurate, position control of the head. A milli-actuator is generally constructed with a piezo element carried by the positionable arm and to which the head is mounted. A current is selectively applied to the piezo element, which causes the piezo element to deform, thereby moving the head a small, controllable amount. This provides a fine adjustment to the position of the head. As track densities become denser, control of the position of the head becomes more critical. Thus, piezo-based milli-actuators are becoming of increasing importance in the head positioning mechanisms.

At least discrete circuits are available for providing drive signals to milli-actuators to control the position of the head of the device or drive with which the milli-actuator is associated. Typically, the milli-actuator drive circuits operate by supplying a control voltage to the piezo element of the milli-actuator.

Although such voltage mode circuits are relatively easy to build, they have several problems. First, the deformation response of piezo elements generally is highly temperature dependent. Thus, significant temperature compensation or calibration circuitry must be provided to assure accurate head positioning over the range of expected operating temperatures of the drive. Secondly, relatively high voltages are required to operate the piezo elements, which may require relatively large circuit components, and may complicate the overall circuit design. Thirdly, piezo elements generally have strong hysteresis effects.

As a result, charge mode milli-actuator circuits have been proposed. Charge mode milli-actuator circuits typically have a capacitor in series with the piezo element, such that a charge builds up on the capacitor that is proportional to the charge on the piezo element. The change in voltage across the capacitor is measured in a given time, and the product of the measured voltage change times the capacitance of the capacitor equals the charge on the capacitor. This value can then be used to adjust the charge supplied to the piezo element. The charge mode technique is still subject to temperature variations and hysteresis effects, but these effects are substantially reduced, and, as a result, the charge mode of operation is more accurate than the voltage mode of operation. On the other hand, the piezo elements are typically large, having capacitances in the range in the thousands of picofarads. Thus, the capacitor that must be used must be proportionately large. Also, the charge used to charge the capacitor is unavailable for charging the piezo element.

One way in which at least some of these problems in the charge mode of operation have been addressed uses a mirror circuit technique in which the milli-actuator circuit provides a 1× mirror circuit connected to a sense capacitor. An n× mirror circuit mirrors the current in the 1× mirror circuit to drive the piezo element. Thus, as the charge on the capacitor changes, the n× output proportionally changes. Thus, at least the size of the sense capacitor can be reduced.

Thus, piezo elements may be driven in voltage or charge mode with advantages for both drive modes. When integrating the two modes into a single amplifier, the compensation of the amplifier must adapt to the selected mode. In addition, when in charge mode, the gain of the 1× closed loop amplifier must be modified depending on the number of piezo elements being driven when a fixed sense capacitor is used. Since the closed loop gain of the 1× amplifier may change from gain of one to gain of ten or more, the amplifier requires adjustable compensation so that a uniform bandwidth can be achieved and the amplifier remains stable.

What is needed, therefore, is a milli-actuator driver circuit that can operate at preestablished voltages other than the full rail voltages of the servo.

SUMMARY OF INVENTION

The solution to the problem is two-fold. To handle both a voltage mode solution and a charge mode solution, the compensation for each mode is different. In voltage mode, a feedback resistor in series with a capacitor is switched from the output of a second stage class AB amplifier to the output of a first stage class A amplifier. However, in the charge mode of operation, this feedback is not used and is switched to ground, and the amplifier is completely load compensated by the capacitor on the 1× output. But in charge mode, the gain of the 1× loop changes depending on the number of piezo elements driven which in a typical hard disk drive may be ten or more. Therefore, the output impedance of the first stage class A amplifier in conjunction with the capacitance seen on that node sets a pole that may inhibit stability at lower closed loop gains. To adapt to the lowering of the closed loop gain, the output resistance of the first stage amplifier is lowered to move the problematic pole out in frequency and keep the amplifier stable. It also keeps the bandwidth versus the closed loop gain mode relatively constant and thus the noise BW of the driver more constant. The output resistance is modified in the current implementation with MOSFETS with their gates tied to drains, however, this could also be accomplished with resistors as well.

What is different about the solution of the present invention, as compared with other solutions to the same problem, is that other solutions employ adjustable compensation, but it is not believed that any previous solutions integrate the two modes of operation and allow for a varying gain change.

Thus, one of the advantages of the present invention is that a single amplifier serves both voltage mode and charge mode drive while also allowing for a varying number of elements to be driven in charge mode where the closed loop gain must change to adjust for the load changes. In all cases, a single amplifier can be allowed to serve these multiple purposes and remain stable.

According to a broad aspect of the invention, an integrated circuit for providing drive signals to a piezo element of a milli-actuator device in a mass data storage device is provided. The device includes a driving circuit for selectively driving the piezo element in either a voltage mode or a charge mode and a circuit for compensating the driving circuit for a variable number of piezo elements in a charge mode of operation and providing a compensating feedback signal in a voltage mode of operation. Preferably, the circuit for compensating the driving circuit for a variable number of piezo elements in a charge mode of operation comprises a circuit for adjusting an output impedance of at least a portion of the driving circuit.

According to another broad aspect of the invention, an integrated circuit for providing drive signals to a piezo element of a milli-actuator device in a mass data storage device is provided. The piezo element includes a variable number of piezo element devices. A Class A amplifier is connected to receive input signals for controlling the piezo element and a Class AB amplifier is connected to receive an output from the Class A amplifier to selectively provide either current mode driving signals or voltage mode driving mode signals to the piezo element. A circuit for compensating the integrated circuit is provided, wherein in a charge mode of operation, the circuit selectively compensates the Class A amplifier for a variable number of piezo element devices, and in a voltage mode of operation, the circuit provides a compensating feedback signal. Preferably, the circuit for compensating the driving circuit for a variable number of piezo elements comprises a circuit for adjusting an output impedance of the Class A amplifier.

According to yet another broad aspect of the invention, a method for providing drive signals to a piezo element of a milli-actuator device in a mass data storage device is provided. The piezo element is of the type that includes a variable number of piezo element devices. The method includes selectively driving the piezo element in either a voltage mode or a charge mode, and compensating the driving circuit for the variable number of piezo element devices in a charge mode of operation and providing a compensating feedback signal in a voltage mode of operation. Preferably, compensating the driving circuit for a variable number of piezo element devices in a charge mode of operation comprises adjusting an output impedance of at least a portion of the driving circuit.

According to still yet another broad aspect of the invention, an integrated circuit for providing drive signals to a piezo element of a milli-actuator device in a mass data storage device is provided. The piezo element includes a variable number of piezo element devices. The integrated circuit includes means for selectively driving the piezo element in either a voltage mode or a charge mode, and means for compensating the driving circuit for the variable number of piezo element devices in a charge mode of operation and providing a compensating feedback signal in a voltage mode of operation. Preferably, the means for compensating the driving circuit for a variable number of piezo element devices in a charge mode of operation comprises means for adjusting an output impedance of at least a portion of the driving circuit.

According to still another broad aspect of the invention, a mass data storage device is provided. The mass data storage device includes an integrated circuit for providing drive signals to a piezo element of a milli-actuator device in a mass data storage device, and a driving circuit for selectively driving the piezo element in either a voltage mode or a charge mode. A circuit is provided for compensating the driving circuit for a variable number of piezo elements in a charge mode of operation and providing a compensating feedback signal in a voltage mode of operation. Preferably, the circuit for compensating the driving circuit for a variable number of piezo elements in a charge mode of operation comprises a circuit for adjusting an output impedance of at least a portion of the driving circuit.

BRIEF DESCRIPTION OF DRAWINGS

The invention is illustrated in the accompanying drawings, in which:

FIGS. 3A and 3B are detailed electrical schematic diagrams showing details of the output drivers of the Class AB output amplifier of FIG. 2.

FIG. 3C is an electrical schematic diagram of externally connected components, including a piezo element driving mirror and a charge measuring capacitor for use with the circuit of FIGS. 3A and 3B.

In the various figures of the drawing, like reference numerals are used to denote like or similar parts.

DETAILED DESCRIPTION

Figure 1:
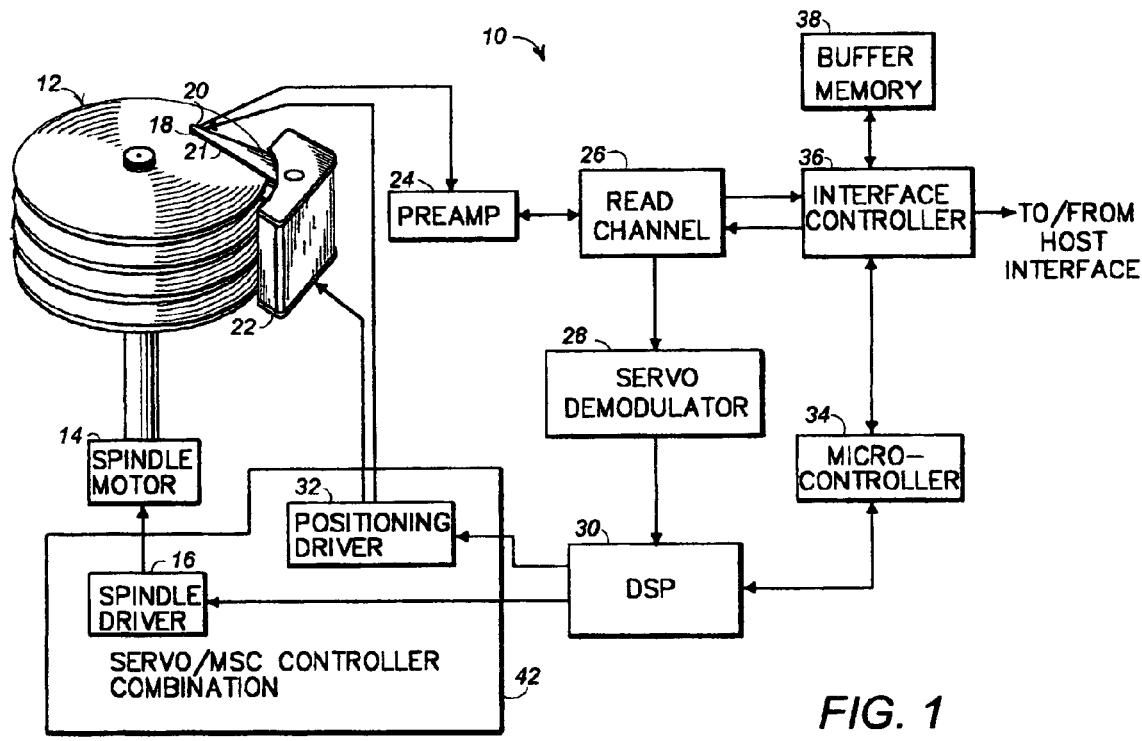
FIG. 1 is a block diagram of a mass data storage device, illustrating the environment of the invention.

FIG. 1 is a block diagram of a generic disk drive system 10, which represents the general environment in which the invention may be practiced. The system 10 includes a magnetic media disk 12 that is rotated by a spindle motor 14 and spindle driver circuit 16. A data transducer or head 18 is locatable along selectable radial tracks (not shown) of the disk 12 by a voice coil motor 22, along a gross radial position. A milli-actuator 20 may be co-located with the head 18 on the end of the arm 21. The milli-actuator is preferably of the type that employs a piezo element for the fine positioning of the head 18, such devices being known in the art. (Although a piezo element type milli-actuator is preferably used, it should be understood that other types of milli-actuator devices may be equally advantageously employed.) The motion of the milli-actuator 20 may be a displacement to the left or right of the axis of the arm 21, to provide fine radial positioning of the head 18 along the track sought to be followed.

The radial tracks may contain magnetic states that contain information about the tracks, such as track identification data, location information, synchronization data, as well as user data, and so forth. The head 18 is used to both record user data to and read user data back from the disk 12. The head 18 also detects signals that identify the tracks and sectors at which data is written, and to detect servo bursts that enable the head 18 to be properly laterally aligned with the tracks of the disk, as known.

Analog electrical signals that are generated by the head 18 in response to the magnetic signals recorded on the disk 12 are preamplified by a preamplifier 24 for delivery to read channel circuitry 26. The servo signals detected from the track being followed are detected and demodulated by one or more servo demodulator circuits 28 and processed by a digital signal processor (DSP) 30 to control the gross and fine positions of the head 18 via a positioning driver circuit 32. In the past, the servo data would that is read and processed has been analog data that has been interpreted by the DSP 30 for positioning the head 18.

A microcontroller 34 is typically provided to control the DSP 30 as well as the interface controller 36 to enable data to be passed to and from the host interface (not shown) in known manner. A data memory 38 may be provided, if desired, to buffer data being written to and read from the disk 18.

Figure 2:
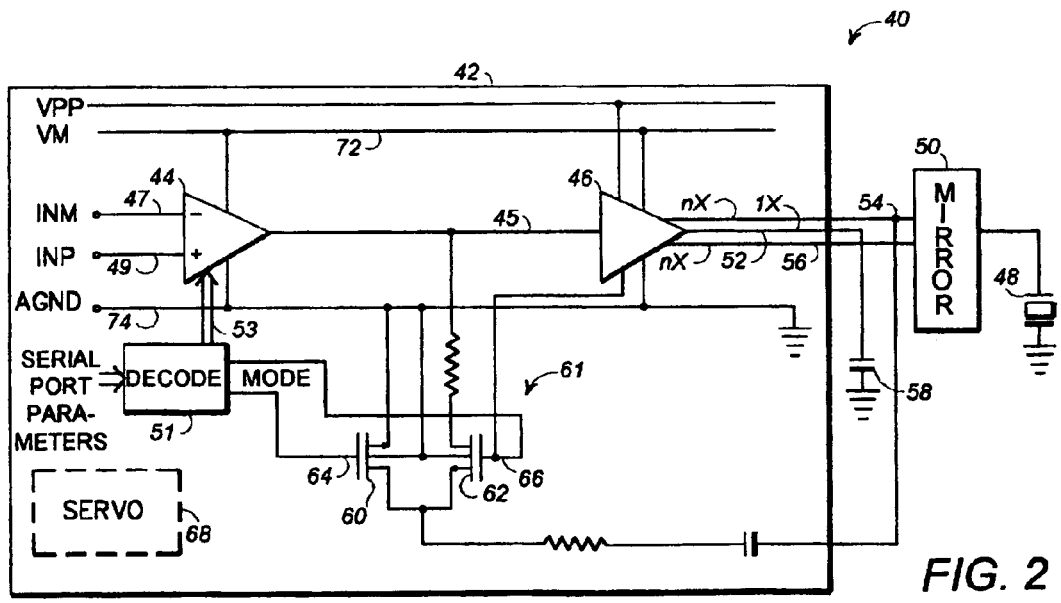
FIG. 2 is an electrical schematic diagram of a portion of the milli-actuator circuit, according to a preferred embodiment of the invention.

FIG. 2 is an electrical schematic diagram of a portion of the positioning driver circuit 32, illustrating the overall structure of a milli-actuator circuit 40, according to a preferred embodiment of the invention. The milli-actuator circuit 40 may be constructed, if desired, on a single integrated circuit chip 42, as shown, together with other associated circuitry, for example, the voice coil driving circuitry and other positioning driver circuitry 32, as well as servo circuitry 68 of the spindle driver 16, and so forth.

The milli-actuator driver circuitry 40 includes two operational transconductance amplifiers (OTAs) stages 44 and 46 to provide milli-actuator driving output signals to control an associated piezo element 48 through an external mirror circuit 50. The output from amplifier 44 is connected to the input of amplifier 46 by line 45. It should be noted that although the piezo element 48 may have a number of positioning elements in practice, only a single element is shown in the drawings for convenience. As will become apparent, the circuit 40 selectively provides either voltage mode or charge mode control of the milli-actuator. The input to the first stage amplifier 44 may be, for example, on lines 47 and 49 from a digital to analog converter (not shown) driven by the DSP 30 to control the piezo element of the milli-actuator.

The first OTA 44 is preferably operated in Class A mode, while the second OTA 46 is preferably operated in Class AB mode. The output of the second OTA 46 has three outputs, below described in detail, which provide a 1× output 52 to the sense capacitor 58 in charge mode, and two n× outputs 54 and 56 to the external current mirror 50 in voltage mode. The multiple "n" of the n× outputs may be as needed for the particular application; for example, in one embodiment n may be 10 to provide a 10× output, and in another embodiment, n may be 6.125 to provide a 6.125× output.

A decoder 51 is provided to decode signals indicating the desired mode of operation of the milli-actuator driving circuit 40, as well as the number of piezo elements that are being driven. The data may be provided, for example, from data that is inputted to the serial port (not shown) of the mass data storage device, to be decoded by the decoder 51. In a preferred embodiment, the decoder 51 may be, for example, merely a memory element into which configuration data is held from the initializing serial port data provided by the mass data storage device manufacturer.

The current or voltage mode of the circuit is controlled by a mode selection circuit 61 that includes two MOS transistors 60 and 62, which have a selection signal from the decoder 51 applied to their respective gates on lines 64 and 66. Thus, when driving the piezo motor in voltage mode, the 1× output 52 of the OTA 46 is disabled and the n× output 54 is used to create a voltage feedback loop through MOS transistor 62. In charge mode, MOS transistor 60 conducts, coupling the n× output 54 to analog ground, AGND 72. Also, in current mode, signals are provided on control lines 53 to the Class A amplifier 44 to control its impedance, as below described in detail.

In charge mode operation, a voltage feedback loop is formed with the 1× output driving the external sense capacitor 58, and the piezo element 48 is driven by the n× outputs 54 and 56. The charge delivered to the piezo element is determined by the ratio of the capacitance of the piezo element and the sense capacitance, the n× current drive ratio, and the voltage applied to the OTA 46 from the voltage source VM 72. The voltage source VM is referenced to analog ground 74.

The external mirror 50 can be implemented with bipolar or MOS devices that support the output range needed for the particular piezo element 48 employed. As mentioned, the piezo element 48 may have a number of positioning elements. Series resistors may be used, if desired, to improve the matching characteristics of the mirror.

Figure 3A:
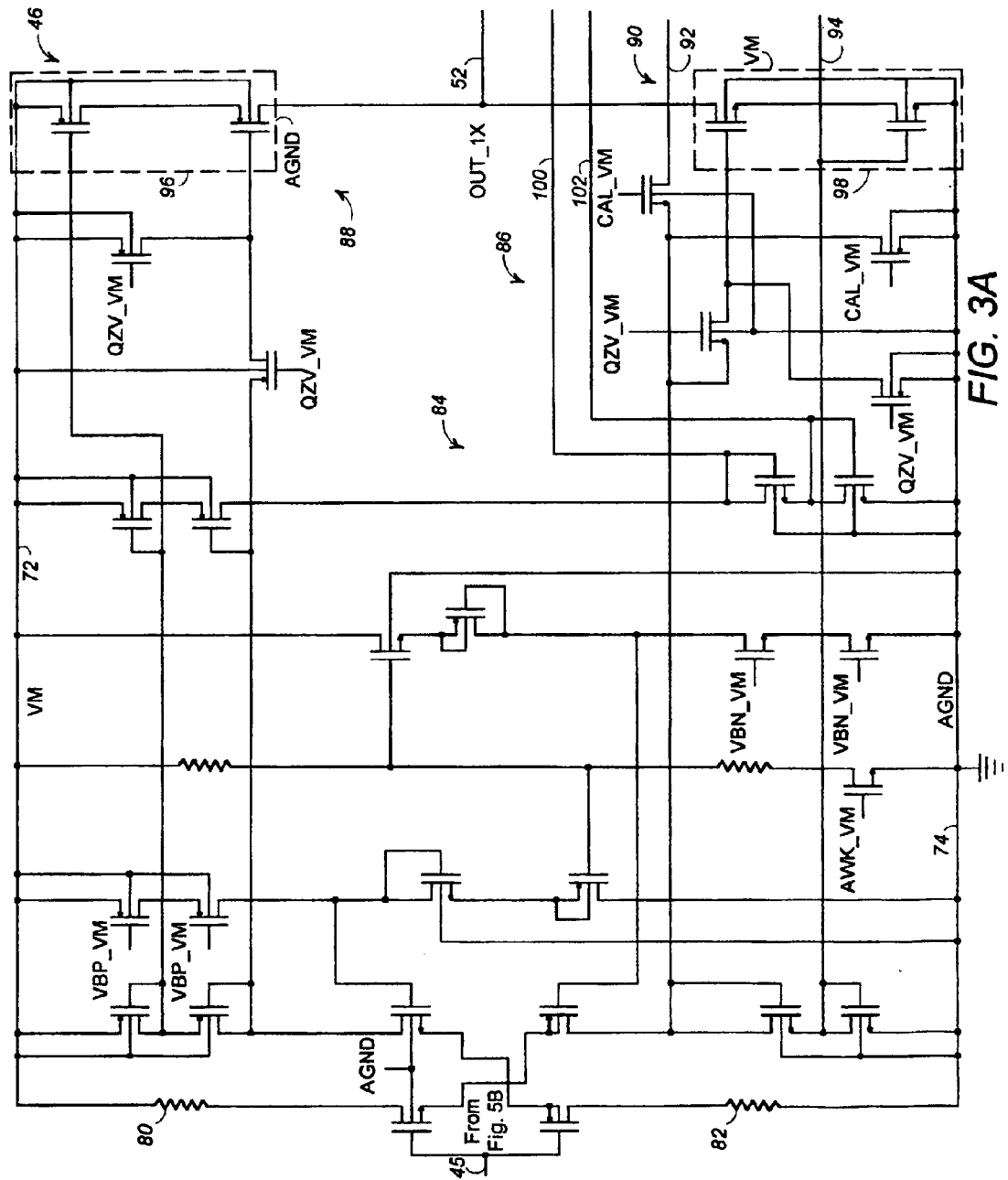

With reference now additionally to FIGS. 3A–B, a detailed schematic of the amplifier 46 is shown. The amplifier 46 is implemented with CMOS devices, and, as shown, operated between a predetermined positive voltage, in this case conveniently, VM, and analog ground, AGND. As mentioned, the amplifier 46 is preferably operated in Class AB mode. Thus, input resistors 80 and 82 are provided to limit the Class AB mode current during switch over.

The circuit 46 includes a shut-off circuit 84 that turns off the 1× output and drives it to a high impedance, for example, when the circuit is operated in voltage mode. A calibration circuit 86, as shown, provides inputs to the circuit 46 on lines 92 and 94. The 1× output is provided on output line 52 by pull-up and pull-down transistors 88 and 90, which are constructed in wells 96 and 98 that are connected respectively to AGND and VM. Thus, the maximum voltage that is applied across the 1× output driver transistors is the difference between VM and AGND, enabling the transistors of the drivers to be integrated onto the same integrated circuit chip as other components of the motor controlling circuitry. Outputs to the n× driver circuits, shown in detail in FIG. 3B, are provided in voltage mode of operation on output lines 110 and 112.

With reference additionally now to FIG. 3B, the details of the n× amplifiers 104 and 106 and the remaining calibration circuitry 108 are shown. It should be noted that the voltage of the n× amplifiers 104 and 106 may be other than the voltage VM of the 1× amplifier; however, they are also referenced to the analog ground potential, AGND.

Details of the external mirror 50 and capacitor 58 are shown in FIG. 3C, to which reference is now additionally made. The mirror receives the outputs from the n× and 1× drivers on respective lines 110, 112, and 52. The mirror circuit is shown as being constructed of bipolar devices; however, it should be understood that MOS devices may be equally advantageously employed.

It can be seen that through the use of mirrors that are biased to a predetermined voltage with respect to ground, the milli-actuator circuit can be easily integrated in an integrated circuit with the wells containing the driver transistors biased to a substrate ground, which may be the analog ground for the circuit. The integration of these components enables the entire circuit to be combined with other integrated circuitry, such as the motor servo, or other desired circuitry. This results in a reduction on the load on the high voltage-switching regulator and reduces the number of required external components.

Figure 4A:
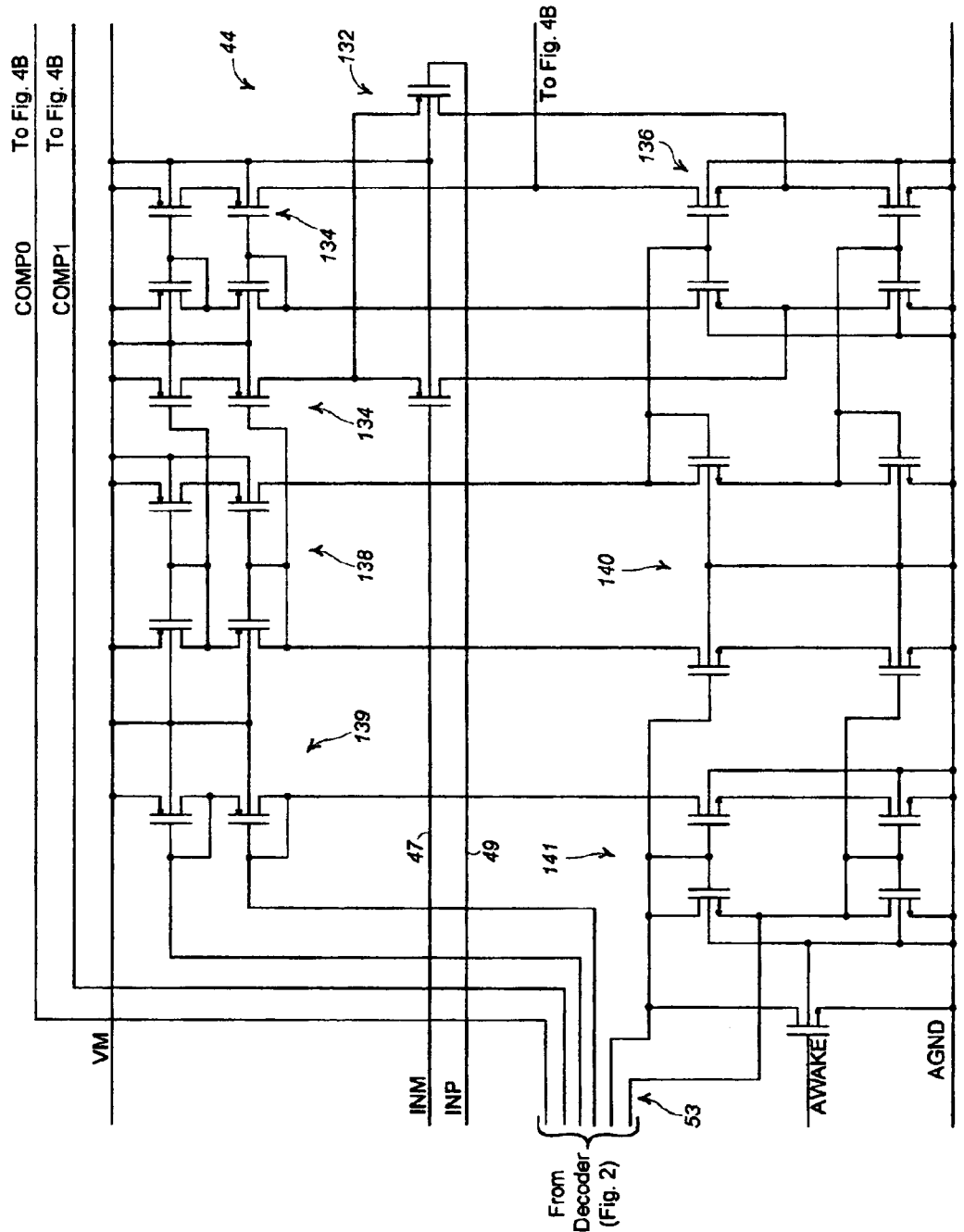
FIGS. 4A and 4B are an electrical schematic diagram of a class A amplifier used in the circuit of FIG. 2, including a circuit for adjusting the output impedance of the circuit depending upon the number of piezo elements in the piezo positioning devices driven and the mode of operation of the circuit, according to a preferred embodiment of the invention.
Figure 4B:
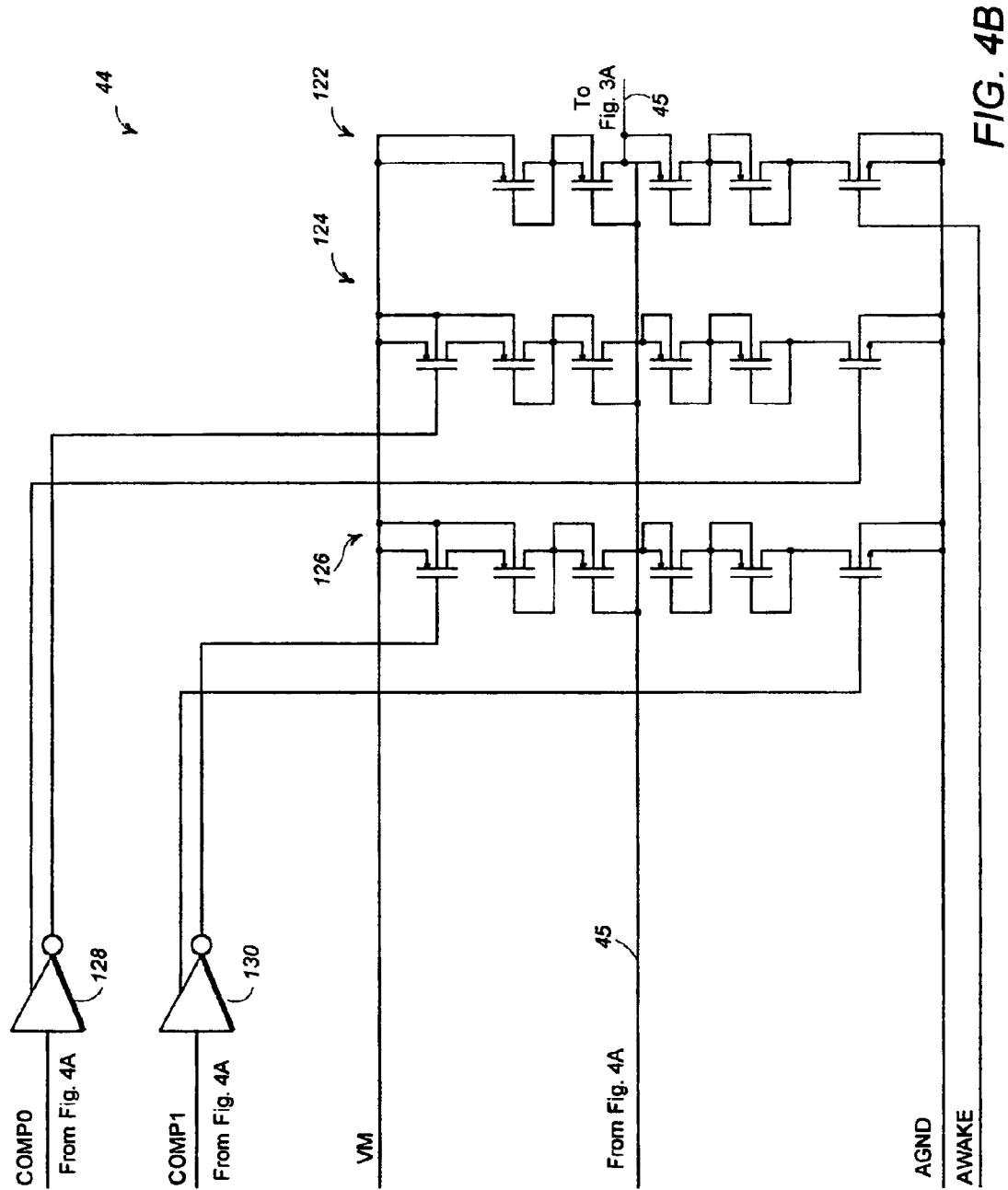

Details of the Class A amplifier 44 are shown in the electrical schematic diagram of FIGS. 4A–B, to which reference is now additionally made. One of the salient problems addressed by the invention is that the gain of the amplifier 44 is variable in charge mode; however, the stability and bandwidth of the amplifier must remain essentially the same. This accomplished by selectively switching impedances into the circuit to maintain the output impedance to make the amplifier self-adjusting for the closed loop gain with essentially the same bandwidth in the current mode of operation.

To this end, the amplifier 44 receives control signals from the decoder 51 on lines 53 to control the impedance of the circuit. More particularly, the circuit 44 includes three chains 122, 124, and 126 of diode connected MOSFETs to establish the high-end impedance of the circuit. Chain 122 is normally on to set an nominal initial impedance or load, and chains 124 and 126 may be selectively turned on by initialization signals from the decoder 120 via respective amplifiers 128 and 130 to compensate for the largest anticipated gain of the circuit. Thus, for example, a typical impedance range of a Class A amplifier of the type described is between about 39 Kohms and 150 Kohms. The high-end range is determined by the combination of the changes 122, 124, and 126 by control signals on lines 53.

Additionally, with reference particularly to FIG. 4A, the input differential amplifier 132 receives the input signals INM and INP on respective lines 47 and 49. Normally load transistors 134 and 136 are provided on the respective source and drain sides of the amplifier 132. By control signals on lines 53 from the decoder 51, however, additional load circuits 138–141 may be selectively connected in parallel with the normal load transistors 134 and 136. Thus, the impedance of the amplifier 44 may be widely controlled, in dependence on the control signals provided on lines 53.

Although MOSFET devices are shown, it should be understood that resistors that are selectively switched into or out of the circuit can be alternatively used. MOSFET devices are preferred because they when integrated onto an integrated circuit chip, they occupy less space than an integrated resistor. The MOSFET devices are designed to provide the desired resistance necessary to enable the overall impedance of the circuit to be selectively adjusted, as desired.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

What is claimed is:

1. An integrated circuit for providing drive signals to a piezo element of a milli-actuator device in a mass data storage device, said piezo element including a variable number of piezo element devices, comprising:

a Class A amplifier connected to receive input signals for controlling said piezo element;

a Class AB amplifier connected to receive an output from said Class A amplifier to selectively provide either current mode driving signals or voltage mode driving mode signals to said piezo element; and a circuit for compensating said integrated circuit, wherein in a charge mode of operation, said circuit for compensating said integrated circuit selectively compensates said Class A amplifier for a variable number of piezo element devices, and wherein in a voltage mode of operation, said circuit for compensating said integrated circuit provides a compensating feedback signal.

2. The integrated circuit of claim 1 wherein said circuit for compensating said driving circuit for a variable number of piezo elements comprises a circuit for adjusting an output impedance of said Class A amplifier.

3. The integrated circuit of claim 2 wherein said circuit for adjusting an output impedance of at said Class A amplifier comprises a plurality of resistance providing elements that are selectively connected in said Class A amplifier.

4. The integrated circuit of claim 3 wherein said resistance providing elements comprise a plurality of series connected MOSFET devices.

5. The integrated circuit of claim 3 wherein said resistance providing elements comprise a plurality of integrated resistors.

6. The integrated circuit of claim 1 further comprising a circuit for containing command data to specify a mode of operation of said integrated circuit.

7. The integrated circuit of claim 6 further comprising circuitry for configuring said integrated circuit to operate in a voltage mode or a current mode in response to said command data to specify a mode of operation of said integrated circuit.

8. The integrated circuit of claim 6 wherein said piezo element has a number of piezo element devices, and further comprising circuitry for configuring a parameter of said integrated circuit to compensate for said number of piezo element devices.

9. The integrated circuit of claim 8 wherein said parameter is an impedance of at least a portion of said integrated circuit.

* * * * *